(12) United States Patent
Shariff et al.

(10) Patent No.: US 9,824,923 B2
(45) Date of Patent: Nov. 21, 2017

(54) SEMICONDUCTOR DEVICE AND METHOD OF FORMING CONDUCTIVE PILLAR HAVING AN EXPANDED BASE

(75) Inventors: Dzafir Shariff, Singapore (SG); Kwong Loon Yam, Singapore (SG); Lai Yee Chia, Singapore (SG); Yung Kuan Hsiao, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 516 days.

(21) Appl. No.: 13/468,981

(22) Filed: May 10, 2012

(65) Prior Publication Data

US 2013/0093100 A1 Apr. 18, 2013

Related U.S. Application Data

(60) Provisional application No. 61/548,120, filed on Oct. 17, 2011.

(51) Int. Cl.
*H01L 23/48* (2006.01)
*H01L 23/52* (2006.01)
(Continued)

(52) U.S. Cl.
CPC .... *H01L 21/76898* (2013.01); *H01L 21/6836* (2013.01); *H01L 23/481* (2013.01);
(Continued)

(58) Field of Classification Search
CPC ....... H01L 23/48; H01L 21/50; H01L 21/768; H01L 21/76898; H01L 23/481;
(Continued)

(56) References Cited

U.S. PATENT DOCUMENTS 6,476,503 B1 * 11/2002 Imamura ............... H01L 21/561
257/737
6,578,754 B1 6/2003 Tung
(Continued)

FOREIGN PATENT DOCUMENTS

CN 101378039 A 3/2009
CN 101897013 A 11/2010
(Continued)

OTHER PUBLICATIONS

Jae-Woong Nah, Electromigration in Flip Chip Solder Joints having a Thick Cu Column Bump and a Shallow Interconnect, Journal of Applied Physics 100 123513, Dec. 26, 2006, 123513-1 thru 123513-5.

*Primary Examiner* — Olik Chaudhuri
*Assistant Examiner* — Wilner Jean Baptiste
(74) *Attorney, Agent, or Firm* — Robert D. Atkins; Patent Law Group: Atkins and Associates, P.C.

(57) ABSTRACT

A semiconductor device has a first semiconductor die and conductive vias in the first semiconductor die. The conductive vias can be formed by extending the vias partially through a first surface of the first semiconductor die. A portion of a second surface of the first semiconductor die is removed to expose the conductive vias. A plurality of conductive pillars is formed over the first surface the first semiconductor die. The conductive pillars include an expanded base electrically connected to the conductive vias. A width of the expanded base of the conductive pillars is greater than a width of a body of the conductive pillars. A conductive layer is formed over a second surface of the first semiconductor die. The conductive layer is electrically connected to the conductive vias. A second semiconductor die is mounted to the first semiconductor die with a second conductive pillar having an expanded base.

18 Claims, 16 Drawing Sheets

(51) Int. Cl.

| | | |
|---|---|---|
| *H01L 29/40* | (2006.01) | |
| *H01L 21/768* | (2006.01) | |
| *H01L 25/065* | (2006.01) | |
| *H01L 23/00* | (2006.01) | |
| *H01L 21/683* | (2006.01) | |

(52) U.S. Cl.
CPC .............. *H01L 24/03* (2013.01); *H01L 24/05* (2013.01); *H01L 24/06* (2013.01); *H01L 24/13* (2013.01); *H01L 25/0657* (2013.01); *H01L 24/16* (2013.01); *H01L 24/81* (2013.01); *H01L 2221/6834* (2013.01); *H01L 2221/68327* (2013.01); *H01L 2224/0332* (2013.01); *H01L 2224/0345* (2013.01); *H01L 2224/0346* (2013.01); *H01L 2224/03472* (2013.01); *H01L 2224/0401* (2013.01); *H01L 2224/056* (2013.01); *H01L 2224/05023* (2013.01); *H01L 2224/05025* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05181* (2013.01); *H01L 2224/05554* (2013.01); *H01L 2224/05555* (2013.01); *H01L 2224/05568* (2013.01); *H01L 2224/05571* (2013.01); *H01L 2224/05624* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05681* (2013.01); *H01L 2224/05684* (2013.01); *H01L 2224/05686* (2013.01); *H01L 2224/06181* (2013.01); *H01L 2224/1132* (2013.01); *H01L 2224/1145* (2013.01); *H01L 2224/1146* (2013.01); *H01L 2224/11472* (2013.01); *H01L 2224/11849* (2013.01); *H01L 2224/131* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13184* (2013.01); *H01L 2224/16145* (2013.01); *H01L 2224/16146* (2013.01); *H01L 2224/16225* (2013.01); *H01L 2224/16227* (2013.01); *H01L 2224/81191* (2013.01); *H01L 2224/83192* (2013.01); *H01L 2224/94* (2013.01); *H01L 2225/06513* (2013.01); *H01L 2225/06517* (2013.01); *H01L 2225/06541* (2013.01); *H01L 2225/06568* (2013.01); *H01L 2924/00011* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01)

(58) Field of Classification Search
CPC . H01L 2224/16225; H01L 2224/03472; H01L 2221/68327; H01L 2224/0332; H01L 2224/05111
USPC .......................................................... 257/774
See application file for complete search history.

(56) References Cited

U.S. PATENT DOCUMENTS

| | | | |
|---|---|---|---|
| 7,569,935 | B1 | 8/2009 | Fan |
| 8,633,057 | B2* | 1/2014 | Chang ............... H01L 23/49805 257/E21.499 |
| 2006/0046468 | A1* | 3/2006 | Akram ............... H01L 21/76898 438/637 |
| 2006/0125042 | A1* | 6/2006 | Fuergut et al. ............... 257/499 |
| 2009/0057893 | A1 | 3/2009 | Iwaki |
| 2009/0057922 | A1 | 3/2009 | Lee et al. |
| 2009/0188706 | A1 | 7/2009 | Endo |
| 2010/0096738 | A1 | 4/2010 | Simmons-Matthews et al. |
| 2010/0244208 | A1* | 9/2010 | Pagaila et al. ................ 257/659 |
| 2010/0246150 | A1 | 9/2010 | Wong et al. |
| 2010/0301493 | A1 | 12/2010 | Gallegos et al. |
| 2010/0308443 | A1* | 12/2010 | Suthiwongsunthorn et al. .............................. 257/621 |
| 2011/0147916 | A1* | 6/2011 | Su .................. 257/692 |
| 2011/0186986 | A1 | 8/2011 | Chuang et al. |
| 2012/0043672 | A1* | 2/2012 | Cho et al. ..................... 257/778 |
| 2012/0086118 | A1* | 4/2012 | Chang ........................... 257/737 |

FOREIGN PATENT DOCUMENTS

| | | |
|---|---|---|
| CN | 101937895 A | 1/2011 |
| CN | 102142418 A | 8/2011 |

\* cited by examiner

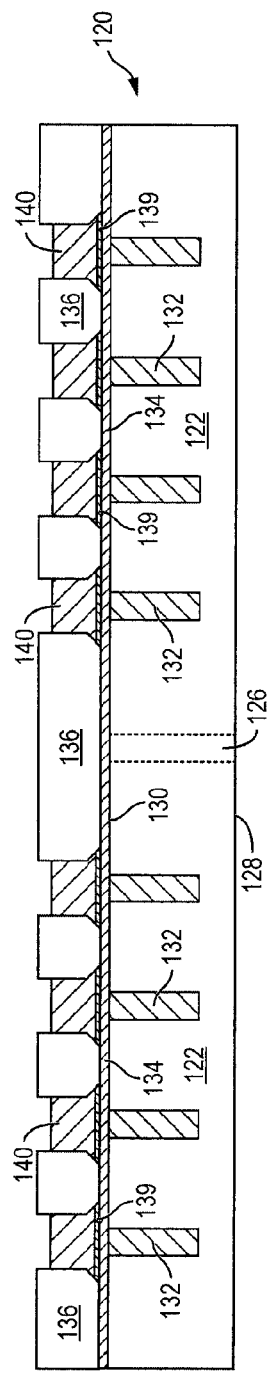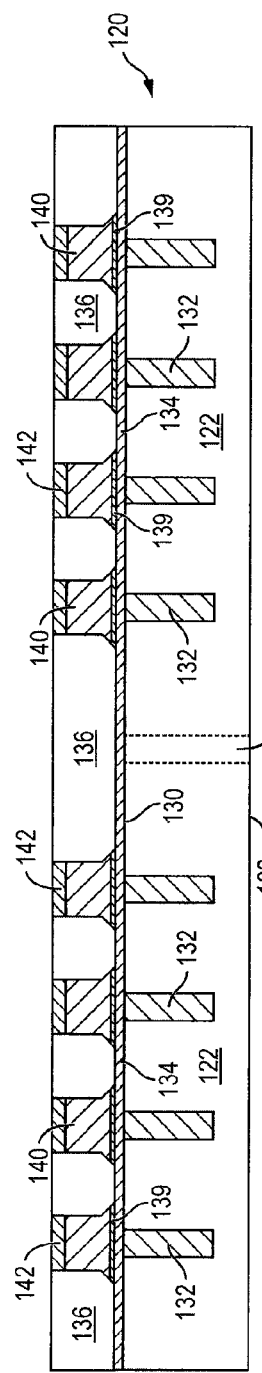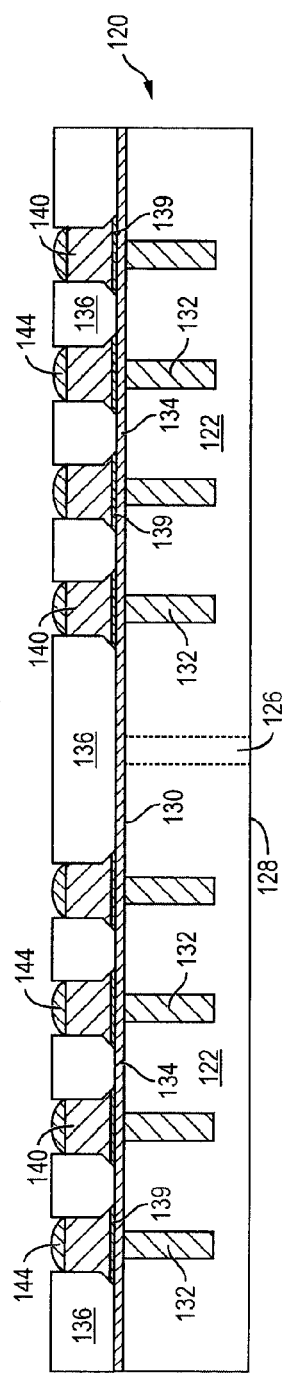

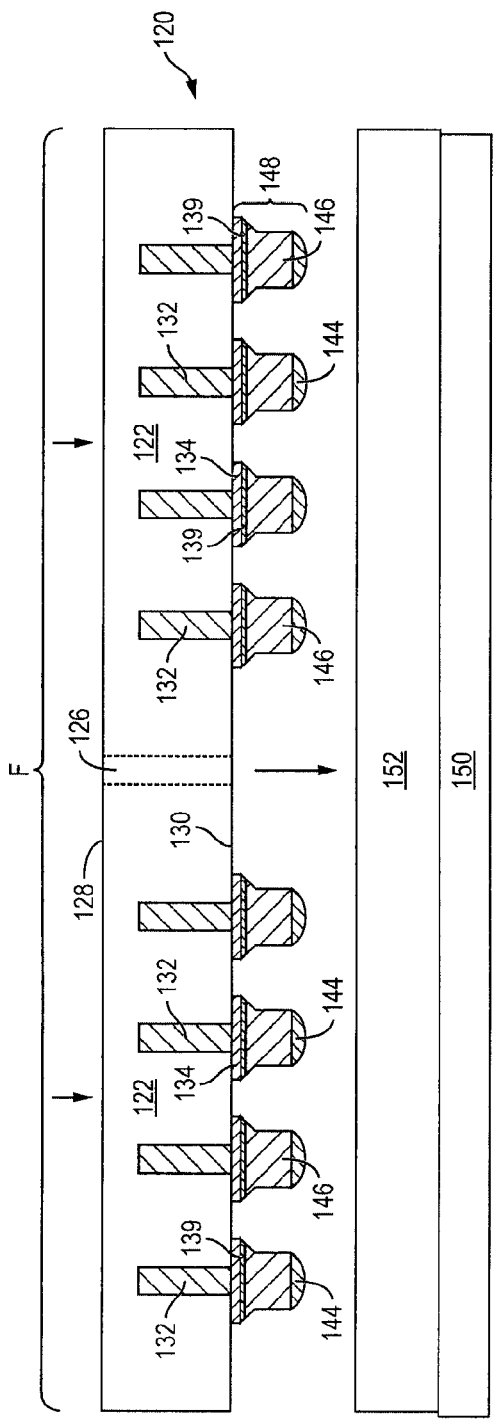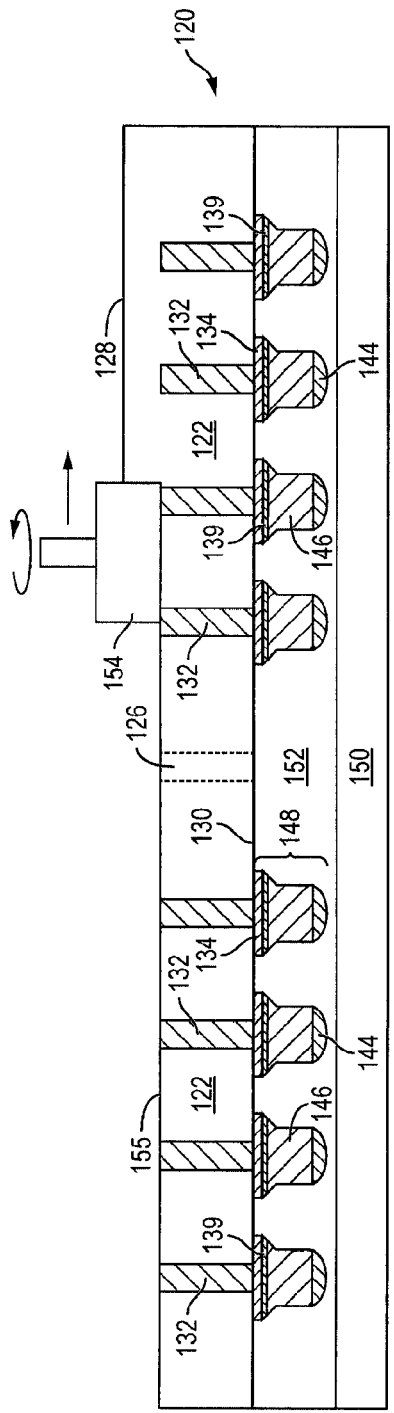

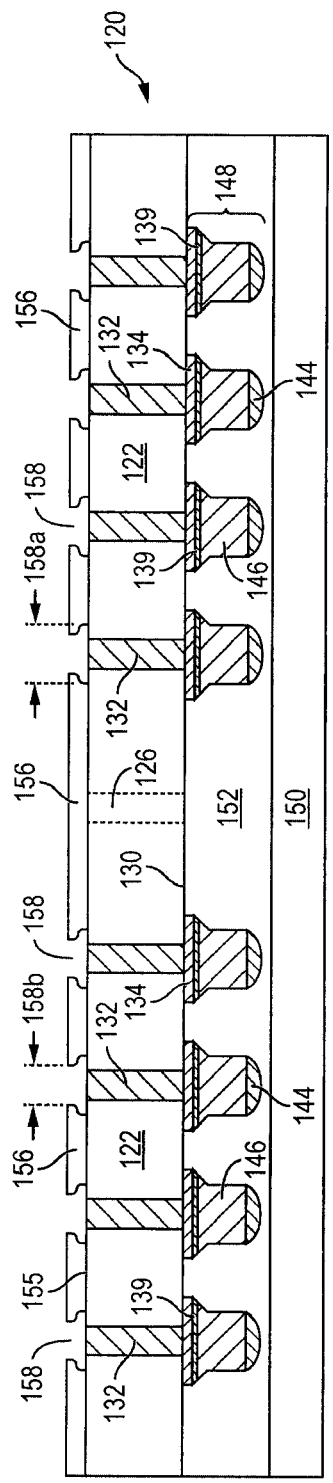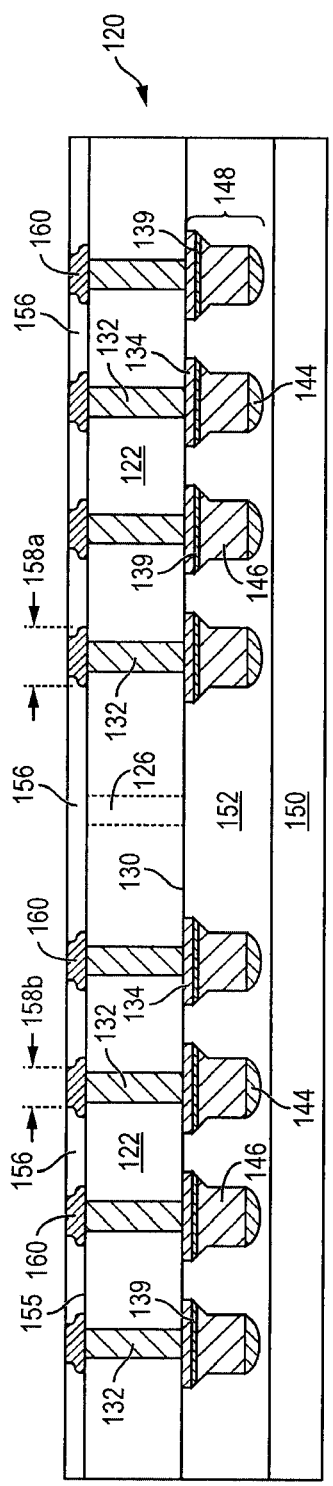

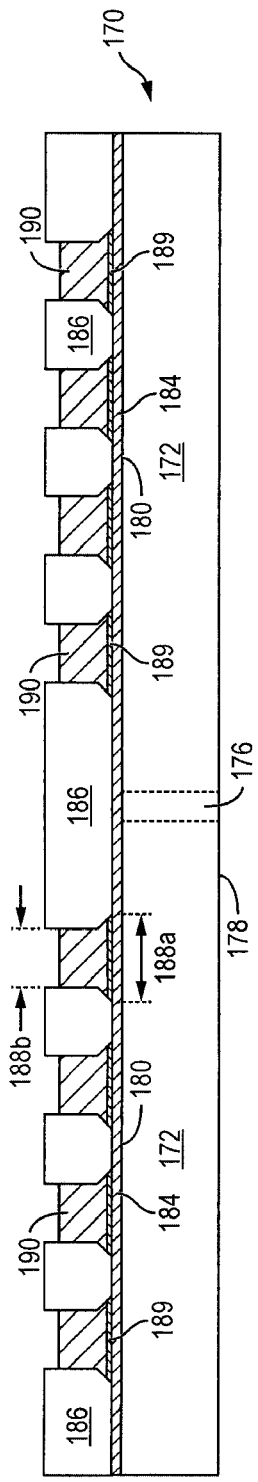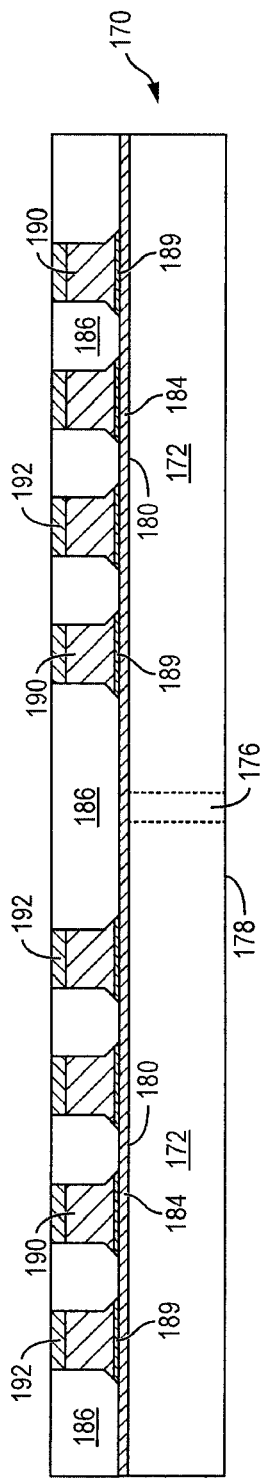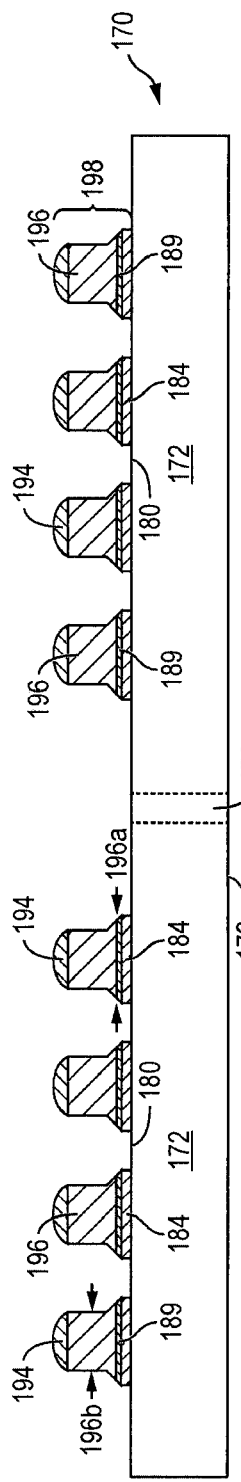

SEMICONDUCTOR DEVICE AND METHOD OF FORMING CONDUCTIVE PILLAR HAVING AN EXPANDED BASE

CLAIM OF DOMESTIC PRIORITY

The present application claims the benefit of Provisional Application No. 61/548,120, filed Oct. 17, 2011, which is incorporated herein by reference.

FIELD OF THE INVENTION

The present invention relates in general to semiconductor devices and, more particularly, to a semiconductor device and method of forming a conductive pillar having an expanded base.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In a conventional semiconductor die, conductive pillars or high profile bumps can be formed over an active surface of the die for vertical offset. The base of the conductive pillars or bumps at the interface to the active surface are commonly undercut during formation of the pillars by etching processes. That is, the base of the conductive pillar is narrower than the body of the conductive pillar. The undercut at the base of the conductive pillar base weakens the bond to semiconductor die, particularly for applications requiring conductive pillars with minimal width for fine pitch and high input/output (I/O) count and density. The weak base of the conductive pillars reduces yield by increasing manufacturing defects, as well as latent defects. The weak base of the conductive pillars are particular susceptible to damage during removal of a temporary carrier, handling, and transport.

SUMMARY OF THE INVENTION

A need exists to maintain the bond strength between conductive pillars and semiconductor die to reduce manufacturing defects. Accordingly, in one embodiment, the present invention is a method of making a semiconductor device comprising the steps of providing a semiconductor wafer, forming a plurality of conductive vias extending into the semiconductor wafer, forming a plurality of conductive pillars over a first surface the semiconductor wafer, and forming a conductive layer over a second surface of the semiconductor wafer opposite the first surface of the semiconductor wafer. The conductive pillars include an expanded base electrically connected to the conductive vias. The conductive layer is electrically connected to the conductive vias.

In another embodiment, the present invention is a method of making a semiconductor device comprising the steps of providing a semiconductor die, forming a conductive via extending into the semiconductor die, and forming a conductive pillar over a first surface of the semiconductor die. The conductive pillar includes an expanded base electrically connected to the conductive via.

In another embodiment, the present invention is a method of making a semiconductor device comprising the steps of providing a first semiconductor die, and forming a first conductive pillar over a first surface of the first semiconductor die. The first conductive pillar includes an expanded base with a width greater than a width of a body of the conductive pillar.

In another embodiment, the present invention is a semiconductor device comprising a first semiconductor die and first conductive pillar formed over a first surface of the first semiconductor die. The first conductive pillar includes an expanded base with a width greater than a width of a body of the conductive pillar.

BRIEF DESCRIPTION OF THE DRAWINGS

FIGS. 5a-5f illustrate a process of forming conductive pillars with an expanded base over a semiconductor die;

DETAILED DESCRIPTION OF THE DRAWINGS

Figure 1:
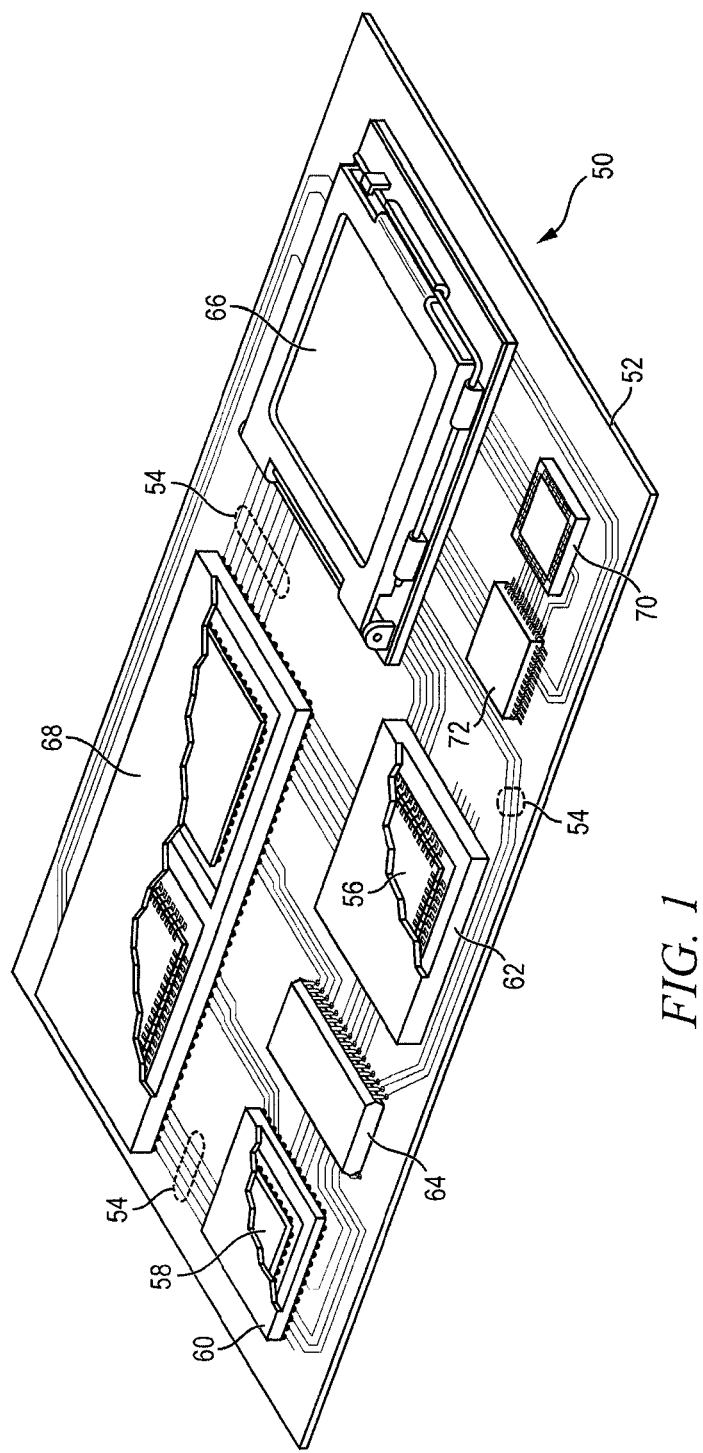
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of the semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
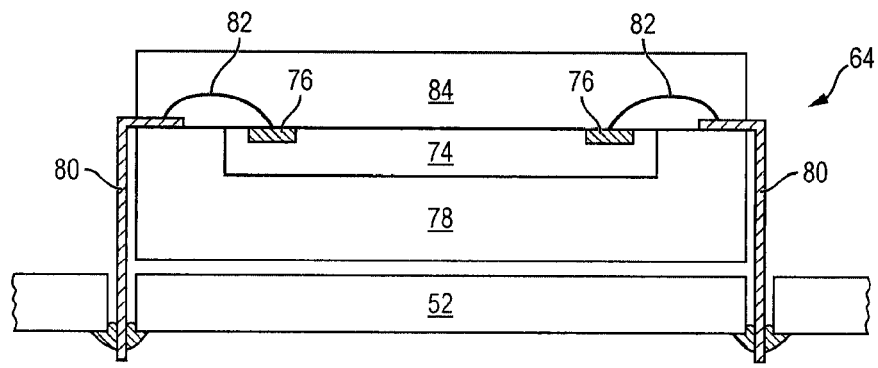
FIGS. 2a-2c illustrate further detail of the representative semiconductor packages mounted to the PCB.
Figure 2B:
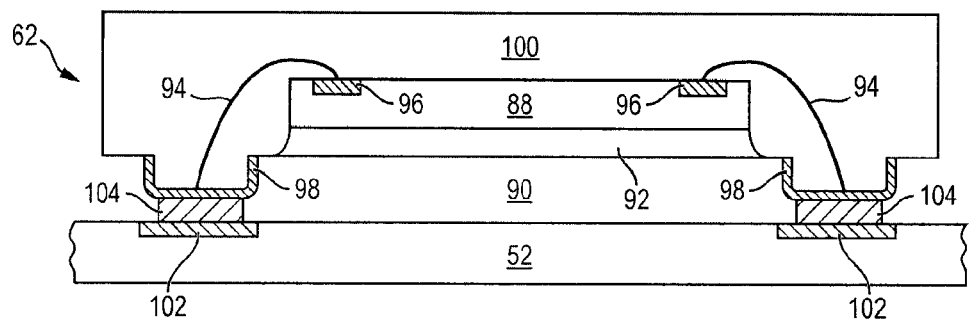
Figure 2C:
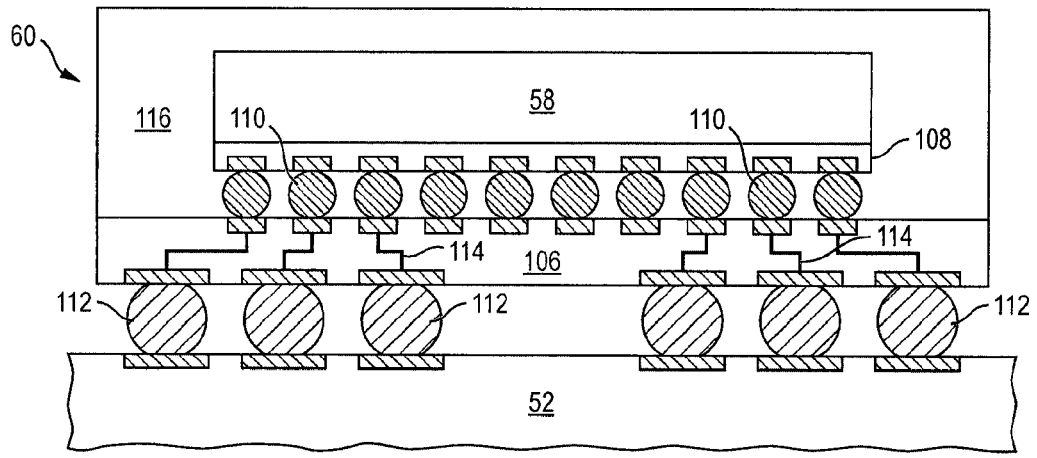

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
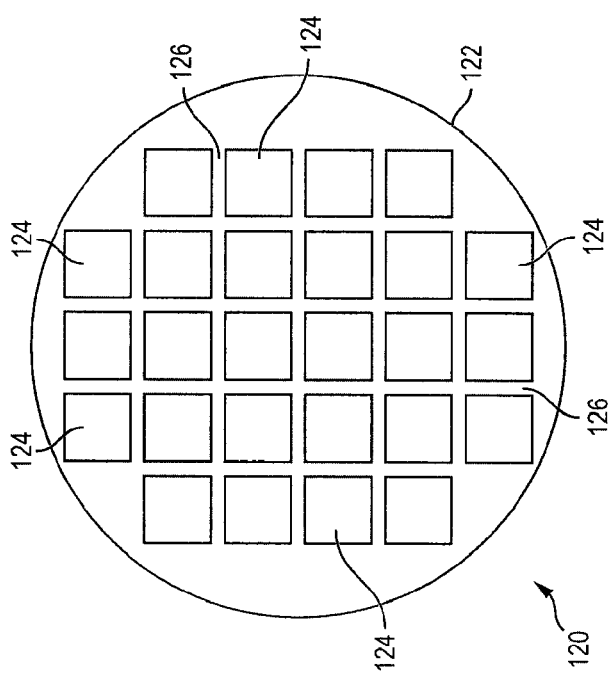
FIGS. 3a-3s illustrate a process of forming conductive vias through a semiconductor die and forming conductive pillars with an expanded base over the semiconductor die.
Figure 3B:
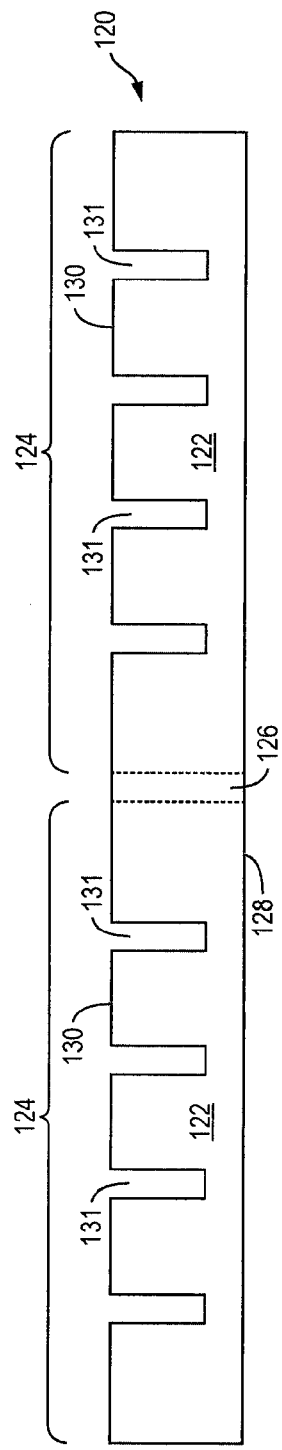
Figure 3C:
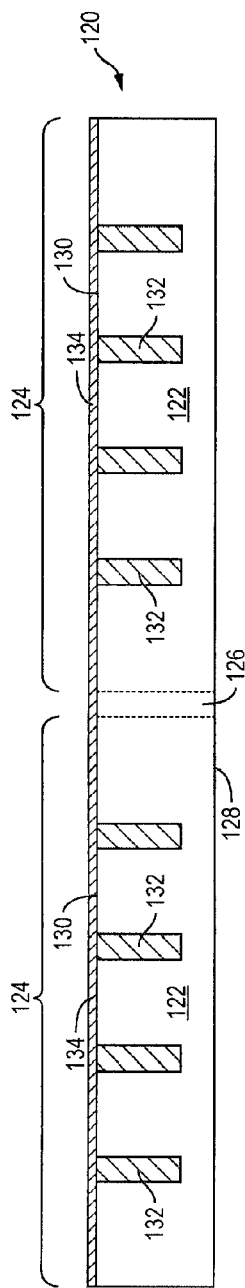
Figure 3D:
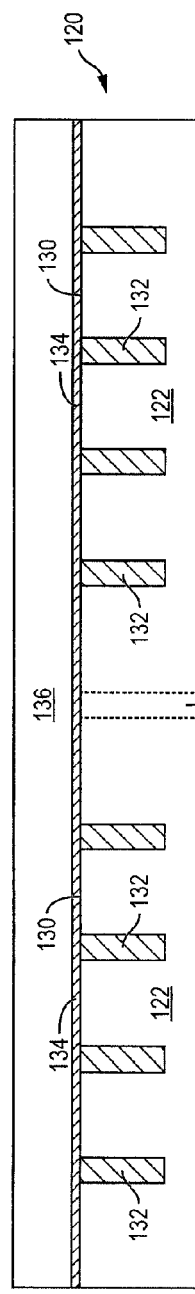
Figure 3E:
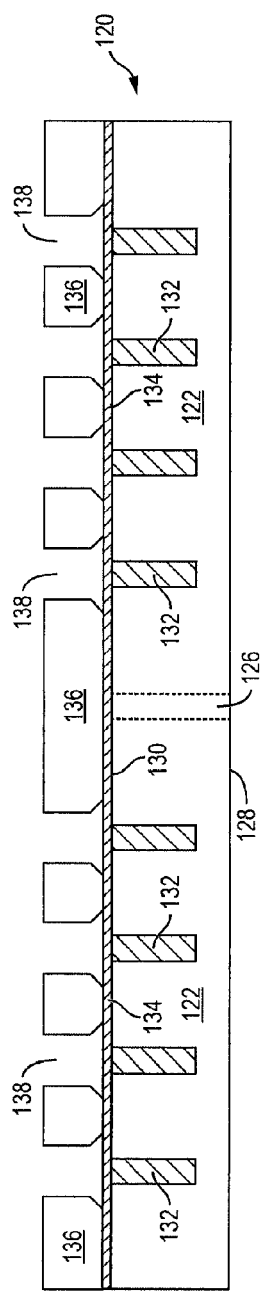
Figure 3F:
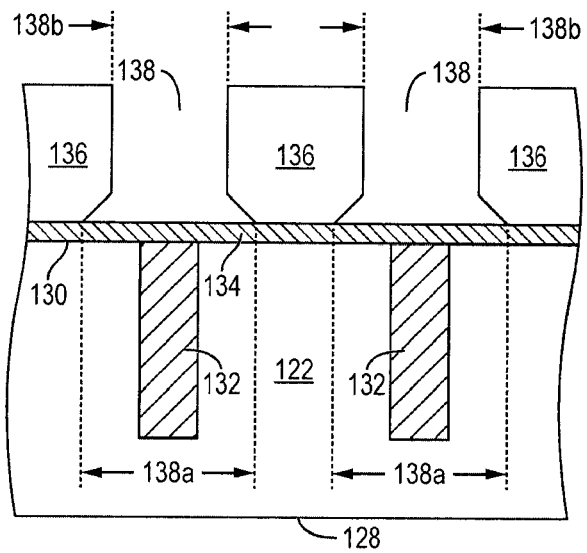
Figure 3G:
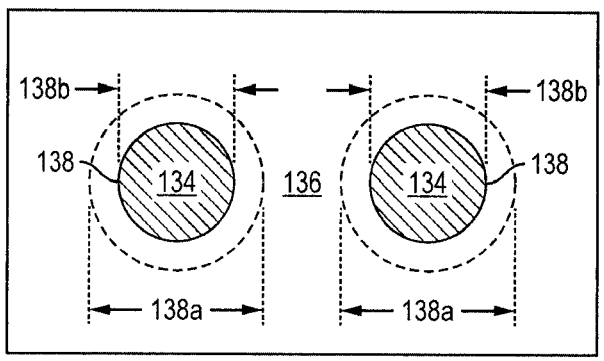
Figure 3H:
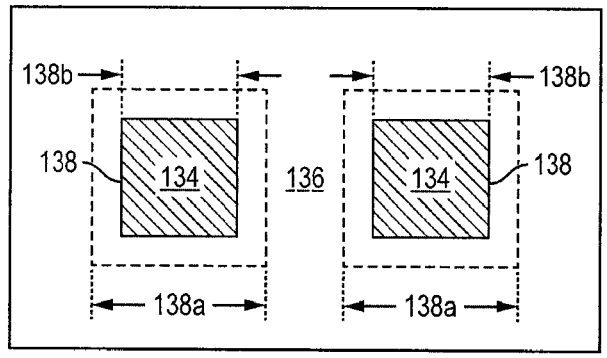
Figure 3L:
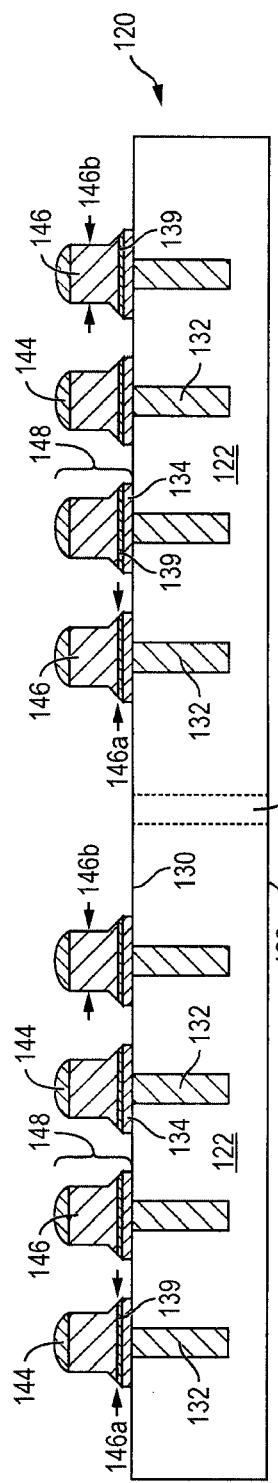
Figure 3M:
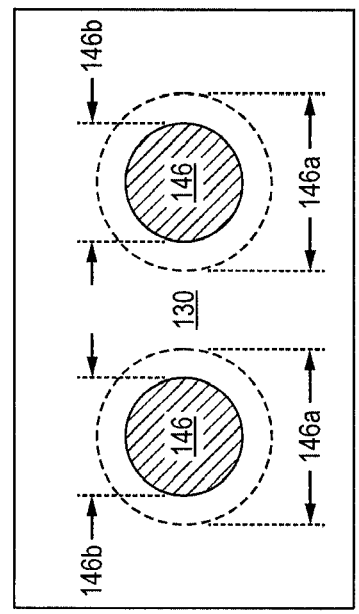
Figure 3R:
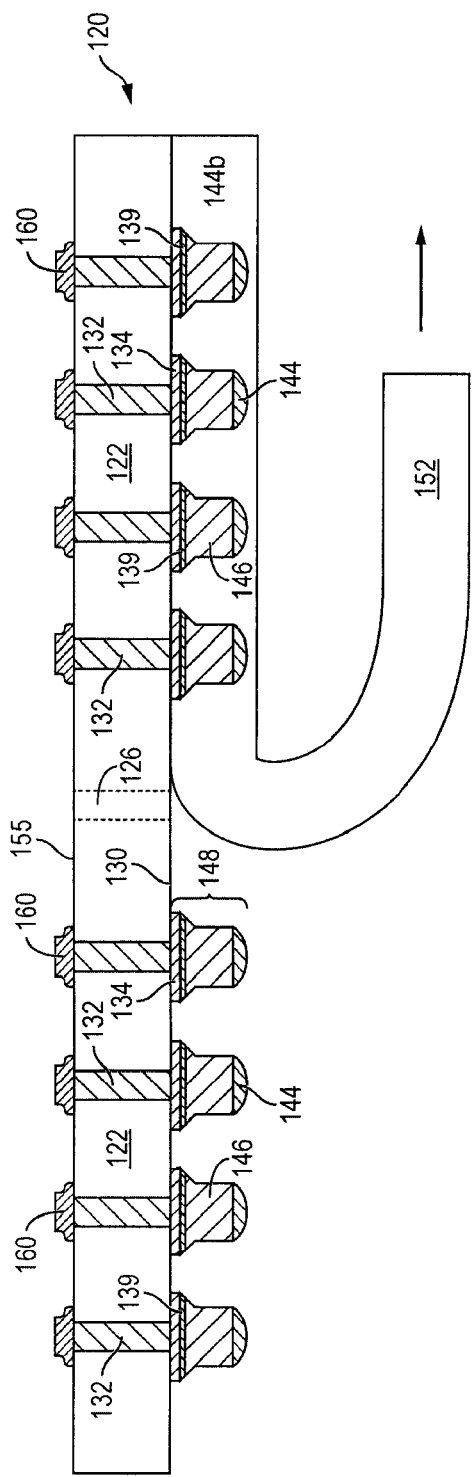
Figure 3S:
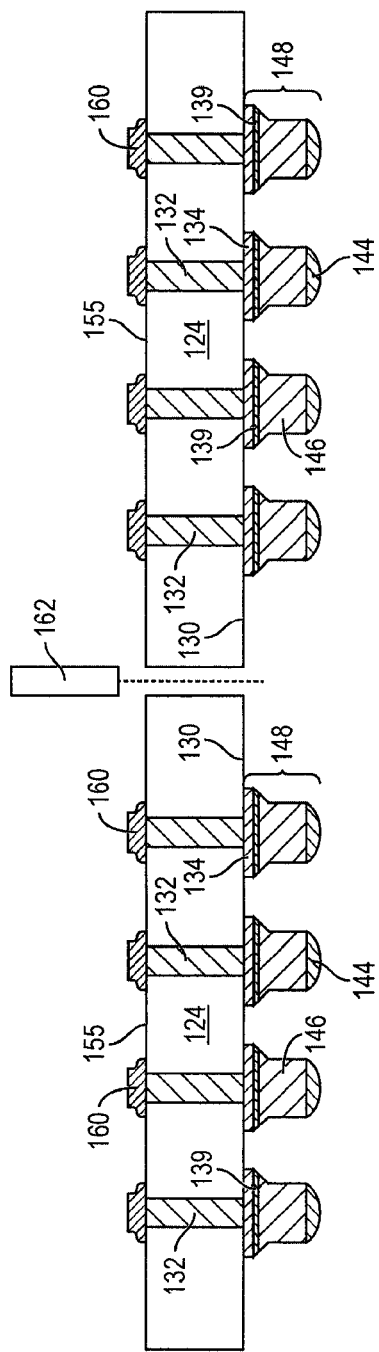

FIGS. 3a-3s illustrate, in relation to FIGS. 1 and 2a-2c, a process of forming conductive vias through a semiconductor die and forming conductive pillars with an expanded base over the semiconductor die. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

A plurality of blind vias 131 is formed from active surface 130 through base substrate material 122 using laser drilling, mechanical drilling, or deep reactive ion etching (DRIE). Blind vias 131 extend partially but not completely through base substrate material 122. Blind vias 131 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive through silicon vias (TSV) 132, as shown in FIG. 3c. Conductive TSV 132 are electrically connected to the circuits on active surface 130.

An electrically conductive layer 134 is formed over active surface 130 and conductive TSV 132 using a blanket metal deposition process such as printing, PVD, CVD, sputtering, electrolytic plating, and electroless plating. Conductive layer 134 is a seed layer containing titanium copper (TiCu), titanium tungsten copper (TiWCu), or tantalum nitrogen copper (TaNCu). Alternatively, conductive layer 134 can be one or more layers of Al, Cu, Sn, Ti, Ni, Au, Ag, or other suitable electrically conductive material.

In FIG. 3d, a patterning or photoresist layer 136 is formed over active surface 130 and conductive layer 134 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. Photoresist layer 136 has a thickness of 20-50 micrometers (μm).

In FIG. 3e, a portion of photoresist layer 136 is removed by an etching process to form patterned openings 138. The patterned openings 138 are positioned to expose conductive TSV 132 and a portion of conductive layer 134. FIG. 3f shows further detail of patterning openings 138. The etch rate is controlled to flare the lower opening portion 138a adjacent to conductive layer 134. Accordingly, a width of expanded opening portion 138a is greater than a width of opening portion 138b. In one embodiment, a width of expanded opening portion 138a is 22 μm and a width of opening portion 138b is 20 μm. Patterned openings 138 can have a circular cross-sectional area configured to form conductive pillars with a cylindrical shape including a circular cross-section. FIG. 3g shows a plan view of patterning openings 138 with a circular cross-sectional area. Alternatively, patterned openings 138 have a rectangular cross-sectional area configured to form conductive pillars with a cubic shape including a rectangular cross-section. FIG. 3h shows a plan view of another embodiment of patterning openings 138 with a rectangular cross-sectional area.

In FIG. 3i, an optional electrically conductive layer 139 is deposited within patterned openings 138 and over active surface 130, conductive layer 134, and conductive TSV 132 using an evaporation, sputtering, electrolytic plating, electroless plating, or screen printing process. Conductive layer 139 can be Cu, Al, W, Au, solder, or other suitable electrically conductive material. In one embodiment, conductive layer 139 is a barrier layer containing Ti or TiW.

An electrically conductive material 140 is deposited within patterned openings 138 and over conductive layer 139 using an evaporation, sputtering, electrolytic plating, electroless plating, or screen printing process. In particular, conductive layer 139 and conductive material 140 fill in the shape of patterned opening 138 to have an expanded base or footing width corresponding to opening portion 138a. Conductive material 140 can be Cu, Al, W, Au, solder, or other suitable non-fusible material. In one embodiment, conductive material 140 is deposited by plating Cu in the patterned openings 138 of photoresist layer 136.

In FIG. 3j, an electrically conductive bump material 142 is deposited within patterned openings 138 over conductive material 140 using an evaporation, electrolytic plating, electroless plating, ball drop, or screen printing process. Bump material 142 can be Al, Sn, Ni, Au, Ag, Pb, Bi, Cu, solder, and combinations thereof, with an optional flux solution. For example, bump material 142 can be eutectic Sn/Pb, high-lead solder, or lead-free solder. Bump material 142 can be reflowed to form a rounded bump cap 144, as shown in FIG. 3k.

In FIG. 3l, photoresist layer 136 is removed by an etching process to leave individual conductive pillars 146 with bump cap 144. A portion of conductive layer 134 outside a footprint of conductive layer 139 and conductive pillars 146 is also removed by an etching process. Bump material 142 can be reflowed after removal of photoresist layer 136 to form rounded bump cap 144. Due to the expanded opening portion 138a, conductive pillars 146 have an expanded base or footing 146a and lesser body or column width 146b. Conductive pillars 146 have a height ranging from 10-120 μm. Conductive pillars 146 can have a cylindrical shape with a circular or oval cross-section, or conductive pillars 146 can have a cubic shape with a rectangular cross-section. FIG. 3m shows a plan view of conductive pillars 146 with a circular cross-sectional area. In another embodiment, conductive pillars 146 can be implemented with stacked bumps or stud bumps.

The combination of conductive pillars 146, conductive layers 134 and 139, and bump cap 144 constitute a composite interconnect structure 148 with a non-fusible portion (conductive pillar 146) and fusible portion (bump cap 144). In one embodiment, composite interconnect structure 148 includes Cu/Sn, Cu/Ni/SnAg, Cu/SnAg, or Cu with any wettable or noble metal.

FIG. 3n shows a temporary substrate or carrier 150 containing sacrificial base material such as silicon, polymer, polymer composite, metal, ceramic, glass, glass epoxy, beryllium oxide, or other suitable low-cost, rigid material for structural support. A penetrable adhesive layer or tape 152 is applied over carrier 150. The penetrable adhesive layer 152 can be single or multi-layer polymer, such as b-staged curable epoxy resin, resistant to heat and mechanical stress. Semiconductor wafer 120 with composite interconnect structures 148 is positioned over and pressed into to penetrable adhesive layer 152 with force F. FIG. 3o shows composite interconnect structures 148 embedded within penetrable adhesive layer 152. The penetrable adhesive layer 152 is cured to securely hold semiconductor wafer 120 in place. A portion of back surface 128 is removed by grinder 154 to expose conductive TSV 132.

FIG. 3p shows semiconductor wafer 120 after the back grinding process with the exposed conductive TSV 132. A patterning or photoresist layer 156 is formed over back surface 155 and conductive TSV 132 using printing, spin coating, or spray coating. In some embodiments that utilize an insulating layer for patterning, the insulating layer can include one or more layers of SiO2, Si3N4, SiON, Ta2O5, Al2O3, or other material having similar structural properties.

A portion of photoresist layer 156 is removed by an etching process to form patterned openings 158. The patterned openings 158 are positioned to expose conductive TSV 132 and a portion of back surface 155 and active surface 130. The etch rate is controlled to flare the lower opening portion 158a adjacent to back surface 155. Accordingly, a width of lower opening portion 158a is greater than a width of opening portion 158b. In one embodiment, a width of lower opening portion 158a is 22 μm and a width of opening portion 158b is 20 μm.

In FIG. 3q, an electrically conductive layer 160 is formed within patterned openings 158 and over back surface 155 and conductive TSV 132 using an evaporation, sputtering, electrolytic plating, electroless plating, or screen printing process. Conductive layer 160 can be one or more layers of Al, Cu, Sn, Ti, Ni, Au, Ag, or other suitable electrically conductive material. In one embodiment, conductive layer 160 is a multi-layer stack under bump metallization (UBM) layer including a seed layer, barrier layer, and adhesion layer. The seed layer can be titanium copper (TiCu), titanium tungsten copper (TiWCu), or tantalum nitrogen copper (TaNCu). The barrier layer can be Ni, nickel vanadium (NiV), platinum (Pt), palladium (Pd), TiW, or CrCu, or other suitable material. The adhesion layer can be Ti, TiN, TiW, Al, or chromium (Cr), or other suitable material. Conductive layer 160 is electrically connected to conductive TSV 132 and the circuits on active surface 130.

In FIG. 3r, carrier 150 is removed by chemical etching, mechanical peeling, CMP, mechanical grinding, thermal bake, UV light, laser scanning, or wet stripping. The penetrable adhesive layer 152 is peeled back to expose active surface 130 and composite interconnect structures 148.

In FIG. 3s, semiconductor wafer 120 is singulated along saw street 126 with saw blade or laser cutting tool 162 into individual semiconductor die 124 with composite interconnect structures 148 and conductive layer 160.

Figure 4:
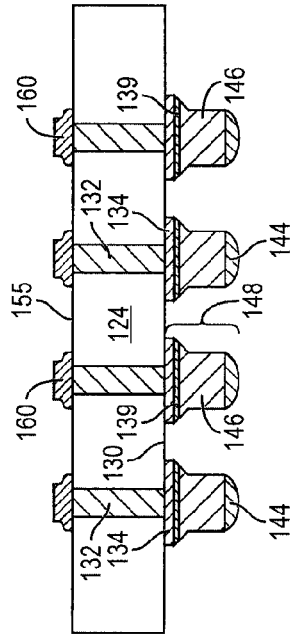
FIG. 4 illustrates the semiconductor die having conductive vias and conductive pillars with an expanded base.

FIG. 4 shows semiconductor die 124 after singulation. In one embodiment, semiconductor die 124 includes logic and memory interface circuits. Active surface 130 of semiconductor die 124 is electrically connected to composite interconnect structures 148 and through conductive vias 132 to conductive layer 160. The composite interconnect structure 148 includes a conductive pillar 146 with expanded base 146a and lesser body or column width 146b. The larger base 146a of conductive pillars 146 increases its strength and robustness to reduce cracking and other damage to the interconnect structure during manufacturing processes, such as die bonding, carrier debonding, handling and transportation. The composite interconnect structure 148 having an expanded base 146a allows for a higher I/O count for semiconductor die 124.

Figure 5A:
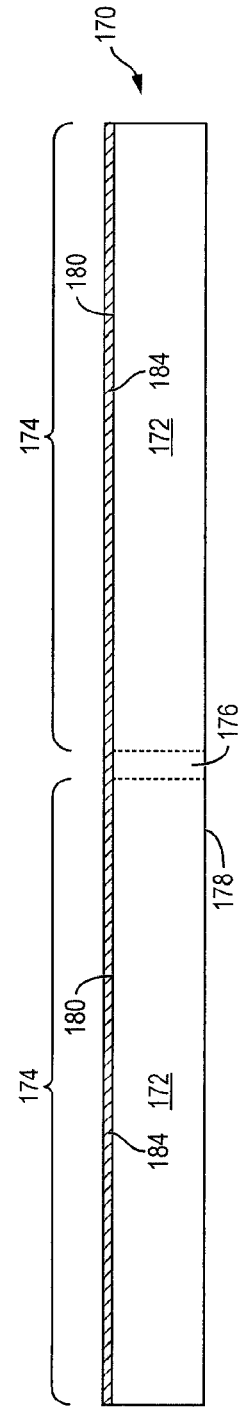

FIGS. 5a-5f illustrate, in relation to FIGS. 1 and 2a-2c, a process of forming conductive pillars with an expanded base over a semiconductor die. FIG. 5a shows a cross-sectional view of a portion of semiconductor wafer 170, similar to FIG. 3a. Each semiconductor die 174 has a back surface 178 and active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 180 to implement analog circuits or digital circuits, such as DSP, ASIC, memory, or other signal processing circuit. Semiconductor die 174 may also contain IPDs, such as inductors, capacitors, and resistors, for RF signal processing.

An electrically conductive layer 184 is formed over active surface 180 using a blanket metal deposition process such as printing, PVD, CVD, sputtering, electrolytic plating, and electroless plating. Conductive layer 184 is a seed layer containing TiCu, TiWCu, or TaNCu. Alternatively, conductive layer 184 can be one or more layers of Al, Cu, Sn, Ti, Ni, Au, Ag, or other suitable electrically conductive material.

Figure 5B:
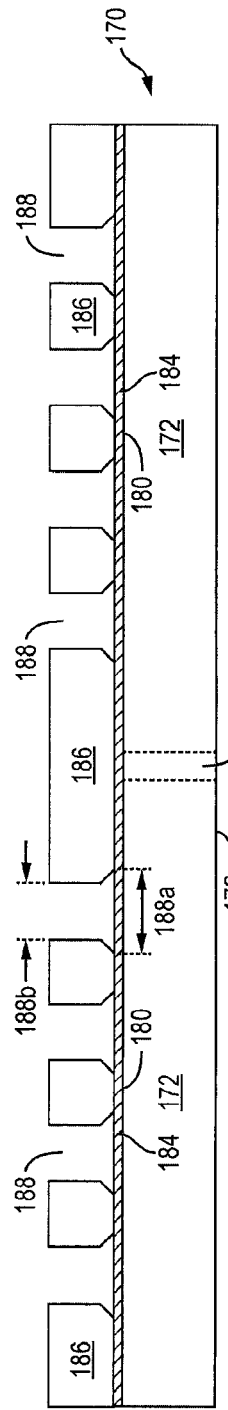

In FIG. 5b, a patterning or photoresist layer 186 is formed over active surface 180 and conductive layer 184 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. Photoresist layer 186 has a thickness of 20-50 µm.

A portion of photoresist layer 186 is removed by an etching process to form patterned openings 188. The patterned openings 188 are positioned to expose a portion of conductive layer 184. The etch rate is controlled to flare the lower opening portion 188a adjacent to conductive layer 184, similar to FIG. 3f. Accordingly, a width of expanded opening portion 188a is greater than a width of opening portion 188b. In one embodiment, a width of expanded opening portion 188a is 22 m and a width of opening portion 188b is 20 µm. Patterned openings 188 can have a circular cross-sectional area configured to form conductive pillars with a cylindrical shape including a circular cross-section, similar to FIG. 3g. Alternatively, patterned openings 188 have a rectangular cross-sectional area configured to form conductive pillars with a cubic shape including a rectangular cross-section, similar to FIG. 3h.

In FIG. 5c, an optional electrically conductive layer 189 is deposited within patterned openings 188 and over active surface 180 and conductive layer 184 using an evaporation, sputtering, electrolytic plating, electroless plating, or screen printing process. Conductive layer 189 can be Cu, Al, W, Au, solder, or other suitable electrically conductive material. In one embodiment, conductive layer 189 is a barrier layer containing Ti or TiW.

An electrically conductive material 190 is deposited within patterned openings 188 and over conductive layer 189 using an evaporation, sputtering, electrolytic plating, electroless plating, or screen printing process. In particular, conductive layer 189 and conductive material 190 fill in the shape of patterned opening 188 to have an expanded base width corresponding to opening portion 188a. Conductive material 190 can be Cu, Al, W, Au, solder, or other suitable non-fusible material. In one embodiment, conductive material 190 is deposited by plating Cu in the patterned openings 188 of photoresist layer 186.

In FIG. 5d, an electrically conductive bump material 192 is deposited within patterned openings 188 over conductive material 190 using an evaporation, electrolytic plating, electroless plating, ball drop, or screen printing process. Bump material 142 can be Al, Sn, Ni, Au, Ag, Pb, Bi, Cu, solder, and combinations thereof, with an optional flux solution. For example, bump material 192 can be eutectic Sn/Pb, high-lead solder, or lead-free solder. Bump material 192 can be reflowed to form a rounded bump cap 194.

In FIG. 5e, photoresist layer 186 is removed by an etching process to leave individual conductive pillars 196 with bump cap 194. A portion of conductive layer 184 outside a footprint of conductive layer 189 and conductive pillars 196 is also removed by an etching process. Bump material 192 can be reflowed after removal of photoresist layer 186 to form rounded bump cap 194. Due to the expanded opening portion 188a, conductive pillars 196 have an expanded base 196a and lesser body or column width 196b. Conductive pillars 196 have a height ranging from 10-120 µm. Conductive pillars 196 can have a cylindrical shape with a circular or oval cross-section, or conductive pillars 196 can have a cubic shape with a rectangular cross-section. In another embodiment, conductive pillars 196 can be implemented with stacked bumps or stud bumps.

The combination of conductive pillars 196, conductive layers 184 and 189, and bump cap 194 constitute a composite interconnect structure 198 with a non-fusible portion (conductive pillar 196) and fusible portion (bump cap 194).

Figure 5F:
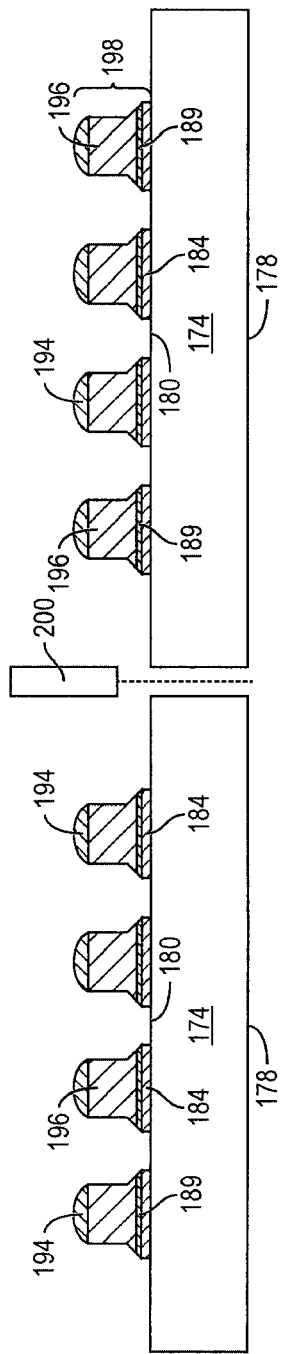

In FIG. 5f, semiconductor wafer 170 is singulated along saw street 176 with saw blade or laser cutting tool 200 into individual semiconductor die 174 with composite interconnect structures 198.

Figure 6:
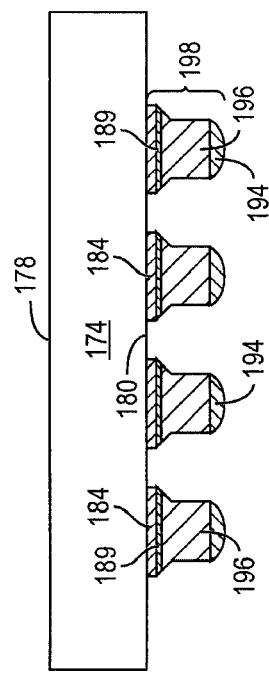
FIG. 6 illustrates the semiconductor die having conductive pillars with an expanded base.

FIG. 6 shows semiconductor die 174 after singulation. Active surface 180 of semiconductor die 174 is electrically connected to composite interconnect structures 198. In one embodiment, semiconductor die 174 includes memory circuits. The composite interconnect structure 198 includes a conductive pillar 196 with expanded base 196a and lesser body or column width 196b. The larger base 196a of conductive pillars 196 increases its strength and robustness to reduce cracking and other damage to the interconnect structure during manufacturing processes, such as die bonding, carrier debonding, handling and transportation. The composite interconnect structure 198 having an expanded base 146a allows for a higher I/O count for semiconductor die 174.

Figure 7A:
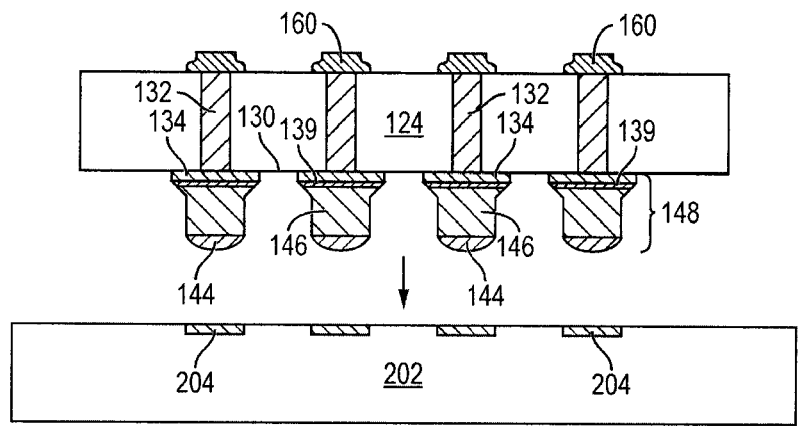
FIGS. 7a-7c illustrate stacking two semiconductor die using conductive pillars with an expanded base.
Figure 7B:
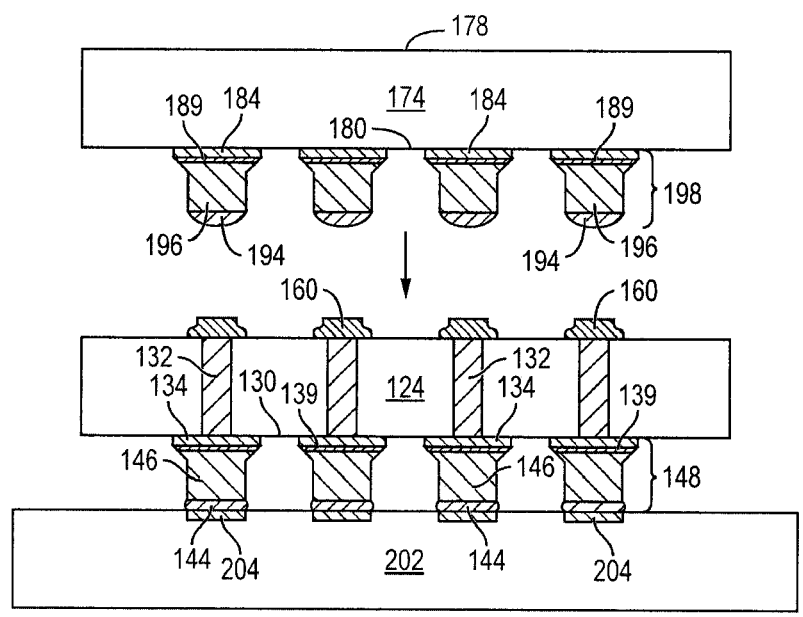
Figure 7C:
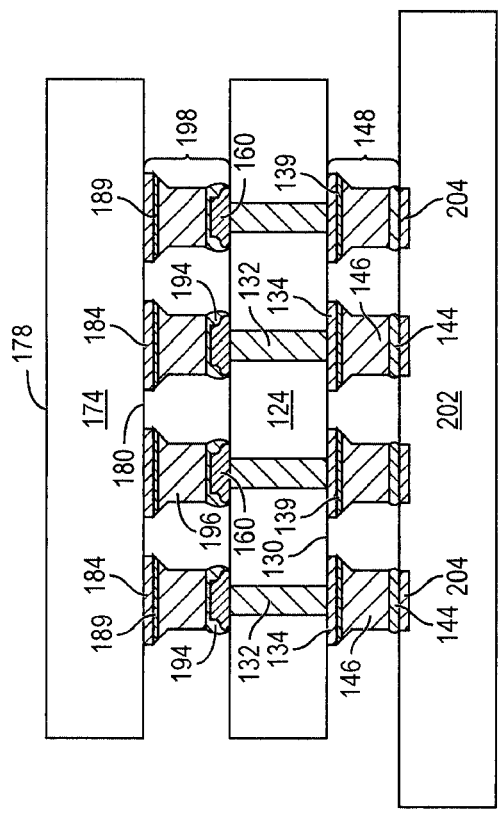

FIG. 7a shows a substrate or PCB 202 with conductive layer 204 formed on a surface of the substrate. Conductive layer 204 operates as conductive traces or contact pads. Semiconductor die 124 from FIG. 4 is positioned over substrate 202 with composite interconnect structures 148 aligned with conductive layer 204. FIG. 7b shows semiconductor die 124 mounted to substrate 202 with composite interconnect structures 148 electrically and metallurgically connected to conductive layer 204. Semiconductor die 174 from FIG. 6 is positioned over semiconductor die 124 composite interconnect structures 198 aligned with conductive layer 160. FIG. 7c shows semiconductor die 174 mounted to semiconductor die 124 with composite interconnect structures 198 electrically and metallurgically connected to conductive layer 160. The circuits on active surface 180 of semiconductor die 174 are electrically connected through composite interconnect structures 198, conductive layer 160, and conductive TSV 132 to the circuits on active surface 130 of semiconductor die 124. The circuits on active surface 130 of semiconductor die 124 and the circuits on active surface 180 of semiconductor die 174 are electrically connected to conductive layer 204 on substrate 202.

In one embodiment, semiconductor die 124 includes logic and memory interface circuits while semiconductor die 174 includes memory circuits. The composite interconnect structures 148 and 198 include a conductive pillar with expanded base and lesser body or column width. The larger base of composite interconnect structures 148 and 198 increases its strength and robustness to reduce cracking and other damage to the interconnect structure during manufacturing processes, such as die bonding, carrier debonding, handling and transportation. The composite interconnect structure 148 and 198 having an expanded base allows for a higher I/O count for semiconductor die 124 and 174.

Figure 8:
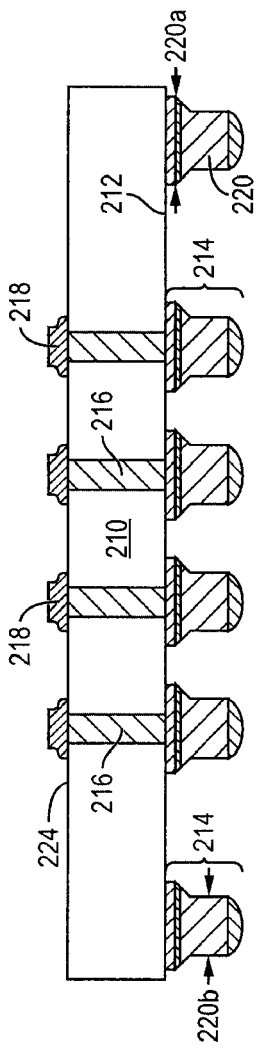
FIG. 8 illustrates a semiconductor die having conductive vias and conductive pillars with an expanded base.

FIG. 8 shows an embodiment combining features of FIGS. 4 and 6 with semiconductor die 210 having portions of active surface 212 electrically connected to composite interconnect structures 214 and through conductive vias 216 to conductive layer 218 formed on back surface 224, similar to FIG. 4. Other portions of active surface 212 are electrically connected to composite interconnect structures 214 without a corresponding conductive vias 216, similar to FIG. 6. The composite interconnect structure 214 includes a conductive pillar 220 with expanded base 220a and lesser body or column width 220b. The larger base 220a of conductive pillars 220 increases its strength and robustness to reduce cracking and other damage to the interconnect structure during manufacturing processes, such as die bonding, carrier debonding, handling and transportation. The composite interconnect structure 214 having an expanded base 220a allows for a higher I/O count for semiconductor die 210.

Figure 9:
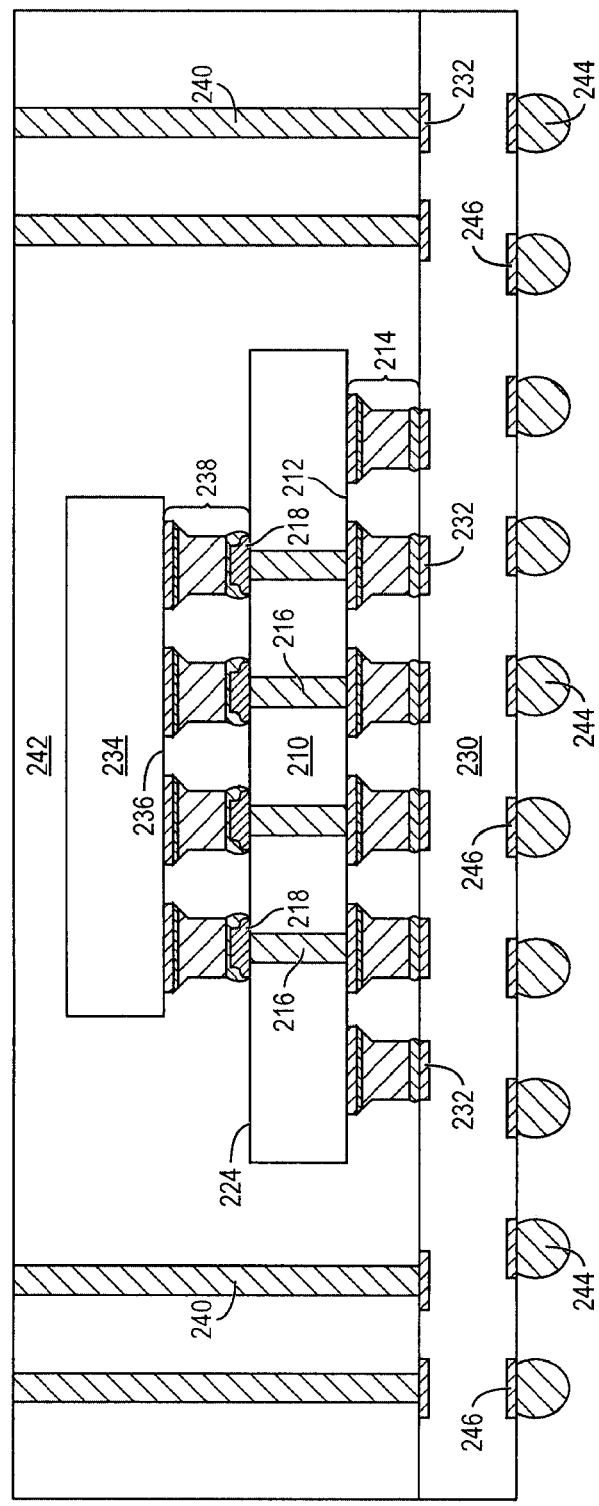
FIG. 9 illustrates stacking two semiconductor die using conductive pillars with an expanded base.

FIG. 9 illustrates semiconductor die 210 from FIG. 8 mounted to substrate 230. Composite conductive structures 214 of semiconductor die 210 are metallurgically and electrically connected to conductive traces or contact pads 232 formed on substrate 230. Semiconductor die 234 includes active surface 236 and a plurality of composite conductive structures 238 formed on the active surface, similar to FIG. 6. Semiconductor die 234 is mounted to semiconductor die 210 with composite conductive structures 238 metallurgically and electrically connected to conductive layer 218.

A plurality of conductive pillars 240 is formed over conductive traces or contact pads 232 on substrate 230. An encapsulant or molding compound 242 is deposited over semiconductor die 210 and 234, substrate 230, and around conductive pillars 240 using a paste printing, compressive molding, transfer molding, liquid encapsulant molding, vacuum lamination, spin coating, or other suitable applicator. Encapsulant 242 can be polymer composite material, such as epoxy resin with filler, epoxy acrylate with filler, or polymer with proper filler. Encapsulant 242 is non-conductive and environmentally protects the semiconductor device from external contaminants. Alternatively, conductive pillars 240 are formed through encapsulant 242. A plurality of bumps 244 is formed over conductive traces or contact pads 246 on a surface of substrate 230 opposite conductive traces 232.

In one embodiment, semiconductor die 210 includes logic and memory interface circuits while semiconductor die 234 includes memory circuits. The composite interconnect structures 214 and 238 include a conductive pillar with expanded base and lesser body or column width. The larger base of conductive pillars 214 and 238 increases its strength and robustness to reduce cracking and other damage to the interconnect structure during manufacturing processes, such as die bonding, carrier debonding, handling and transportation. The composite interconnect structures 214 and 238 having an expanded base allows for a higher I/O count for semiconductor die 210 and 234.

While one or more embodiments of the present invention have been illustrated in detail, the skilled artisan will appreciate that modifications and adaptations to those embodiments may be made without departing from the scope of the present invention as set forth in the following claims.

What is claimed:
1. A semiconductor device, comprising:
a first semiconductor die;
a first conductive layer formed over a first surface of the first semiconductor die; and
a first conductive pillar formed in contact with the first conductive layer, the first conductive pillar including,
(a) a body with a first width, and
(b) an expanded base with a second width at the first conductive layer greater than the first width,
wherein the expanded base increases in width from the first width to the second width in a linear manner.
2. The semiconductor device of claim 1, further including a conductive via formed in the first semiconductor die.
3. The semiconductor device of claim 2, further including a second conductive layer formed over a second surface of the first semiconductor die opposite the first surface of the first semiconductor die and electrically connected to the conductive via.
4. The semiconductor device of claim 1, further including a second semiconductor die disposed over the first semiconductor die.
5. The semiconductor device of claim 4, further including a second conductive pillar formed over the second semiconductor die, the second conductive pillar including an expanded base.
6. A semiconductor device, comprising:
a first semiconductor die;
a conductive via extending into the first semiconductor die;
a conductive pillar including a body and an expanded base formed over a first surface of the first semiconductor die and electrically connected to the conductive via, wherein the body has a first width and the expanded base increases in width from the first width to a second width at the first surface of the first semiconductor die; and
a first conductive layer formed over a second surface of the first semiconductor die opposite the first surface of the first semiconductor die and electrically connected to the conductive via.
7. The semiconductor device of claim 6, wherein a width of the expanded base of the conductive pillar is greater than a width of the body of the conductive pillar.
8. The semiconductor device of claim 6, wherein the material of the conductive pillar includes a non-fusible material.
9. The semiconductor device of claim 8, further including a fusible cap formed over the conductive pillar.
10. The semiconductor device of claim 6, further including a second semiconductor die disposed over the first semiconductor die and electrically connected to the conductive pillar through the conductive via.
11. The semiconductor device of claim 6, further including a second conductive layer formed between the first surface of the first semiconductor die and conductive pillar.
12. A semiconductor device, comprising:
a first semiconductor die;
a conductive via extending into the first semiconductor die; and
a conductive pillar formed over a first surface of the first semiconductor die and electrically connected to the conductive via, wherein the conductive pillar includes a body and an expanded base continuously flared out from a first width of the body to a second width at the first surface of the first semiconductor die.
13. The semiconductor device of claim 12, further including a conductive layer formed over a second surface of the first semiconductor die opposite the first surface of the first semiconductor die and electrically connected to the conductive via.

14. The semiconductor device of claim 12, wherein a width of the expanded base of the conductive pillar is greater than a width of the body of the conductive pillar.

15. The semiconductor device of claim 12, wherein the conductive pillar includes a non-fusible material.

16. The semiconductor device of claim 15, further including a fusible cap formed over the conductive pillar.

17. The semiconductor device of claim 12, further including a second semiconductor die disposed over the first semiconductor die and electrically connected to the conductive pillar through the conductive via.

18. The semiconductor device of claim 12, further including a conductive layer formed between the first surface of the first semiconductor die and conductive pillar.

* * * * *